United States Patent
Lee et al.

(10) Patent No.: US 9,711,435 B2
(45) Date of Patent: Jul. 18, 2017

(54) SEMICONDUCTOR DEVICE

(71) Applicant: SAMSUNG ELECTRONICS CO., LTD., Suwon-si (KR)

(72) Inventors: Youn-seung Lee, Seoul (KR); Jin-hyung Lee, Anyang-si (KR); Gil-yong Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 14/448,190

(22) Filed: Jul. 31, 2014

(65) Prior Publication Data
US 2015/0214137 A1    Jul. 30, 2015

(30) Foreign Application Priority Data

Jan. 27, 2014   (KR) .................. 10-2014-0009469

(51) Int. Cl.
*H01L 23/495* (2006.01)
*H01L 23/31* (2006.01)
*H01L 23/60* (2006.01)

(52) U.S. Cl.
CPC .... *H01L 23/49524* (2013.01); *H01L 23/3107* (2013.01); *H01L 23/49562* (2013.01); *H01L 23/60* (2013.01); *H01L 2224/48247* (2013.01); *H01L 2924/0002* (2013.01)

(58) Field of Classification Search
CPC ............... H01L 23/49524; H01L 23/60; H01L 23/49562; H01L 23/3107; H01L 2924/0002; H01L 2924/00; H01L 2224/48247

USPC ................. 257/676, 669, 670, 671
See application file for complete search history.

(56) References Cited

U.S. PATENT DOCUMENTS 6,362,517 B1    3/2002   Bell et al.
2004/0232541 A1   11/2004   Son et al.

FOREIGN PATENT DOCUMENTS

| DE | 10142472 A1 | 10/2002 |
|----|-------------|---------|
| EP | 0418891 A2  | 3/1991  |
| EP | 0511702 A2  | 11/1992 |
| JP | S 59115653 U | 8/1984 |
| JP | S 6371547 U | 5/1988  |
| JP | H 379442 U  | 8/1991  |
| JP | H 548356 U  | 6/1993  |
| JP | H 6349980 A | 12/1994 |
| JP | H 8236679 A | 9/1996  |

OTHER PUBLICATIONS

Communication dated Sep. 4, 2015, issued by the European Patent Office in counterpart European Application No. 15152471.7.
Communication issued May 18, 2017 by the European Patent Office in counterpart European Patent Application No. 15152471.7.

*Primary Examiner* — (Vikki) Hoa B Trinh
(74) *Attorney, Agent, or Firm* — Sughrue Mion, PLLC

(57) ABSTRACT

A semiconductor device is provided. The semiconductor device may include a frame portion on which at least one semiconductor chip is arranged; a plurality of leads electrically connected to the semiconductor chip; and a mold portion formed on the frame portion to surround a part of the frame portion on which the semiconductor chip and the plurality of leads are arranged, wherein a gap between closest portions of the respective leads is at least 2.9 mm.

18 Claims, 6 Drawing Sheets

US 9,711,435 B2

SEMICONDUCTOR DEVICE

PRIORITY

This application claims priority from Korean Patent Application No. 10-2014-0009469, filed on Jan. 27, 2014, in the Korean Intellectual Property Office, the disclosure of which is incorporated herein in its entirety by reference.

BACKGROUND

1. Field

Apparatuses and methods consistent with exemplary embodiments relate to a semiconductor device, and more particularly to a semiconductor device having a plurality of leads that are soldered on a printed circuit board (PCB).

2. Description of the Related Art

A field effect transistor (FET) that is a kind of semiconductor device is classified into a junction FET, a metal-oxide-semiconductor FET (MOS-FET), and a Gallium arsenide FET (GaAs FET). The junction FET is used in an analog circuit, such as an audio device, the MOS-FET is used in a digital integrated circuit (IC), such as a microcomputer, and the GaAs FET is used to amplify microwaves that are received through satellite broadcasting.

The FET is also classified into a small-signal transistor and a power transistor, and the power transistor typically has a power rating of more than 1 W. The maximum collector current and the maximum collector loss of the power transistor are greater than those of the small-signal transistor. The power transistor has a large size to cope with heat generation, and may be shielded by metal or may be provided with a heat dissipation fin.

However, in the case of the power transistor (e.g., FET for switching), leads are arranged with very narrow gaps between them. Accordingly, short circuits between adjacent leads may occur due to moisture condensation under high-moisture conditions, and a short circuit due to soldering ball inferiority between terminals and foreign substances may occur.

Further, in order to cool the heat generated from the power transistor, a frame portion is screw-engaged with a heat sink, and heat transfer compounds are spread on the frame portion and the heat sink to efficiently dissipate the heat generated from a semiconductor chip arranged inside the power transistor.

In this case, since a gap between the leads and the heat sink also becomes narrow, short circuits may occur between the respective leads.

In order to solve the problem of the short circuits that may occur due to the narrow gaps between the respective leads or between the leads and the heat sink, the semiconductor device is first soldered on the PCB, and then a predetermined amount of waterproofing material (e.g., sealant) is spread on the plurality of leads to insulate the plurality of leads and to remove inferiority elements, such as the short circuits between the leads.

However, since errors frequently occur in the spread positions of the waterproofing material during the waterproofing process, the short-circuit problem still remains unsolved, and the productivity is deteriorated due to additional waterproofing process to the manufacturing process.

SUMMARY

Accordingly, one or more exemplary embodiments provide a semiconductor device which can prevent short-circuit that may occur due to a narrow gap between a plurality of leads.

According to an aspect of an exemplary embodiment, there is provided a semiconductor device including a frame portion on which at least one semiconductor chip is arranged; a plurality of leads electrically connected to the semiconductor chip; and a mold portion formed on the frame portion to surround a part of the frame portion on which the semiconductor chip and the plurality of leads are arranged, wherein a gap between closest portions of the respective leads is at least 2.9 mm.

The gap between the closest portions of the respective leads is less than 5.0 mm.

The plurality of leads may have grasp portions formed thereon, and a width of the grasp portion is wider than a width of the other portion of the lead. the grasp portions of the respective leads may be the closest portions of the respective leads.

The gap between the closest portions of the respective leads is a gap between the grasp portions of the respective leads.

The frame portion is fixed to a heat sink, and a gap between the plurality of leads and the heat sink is at least 2.9 mm.

The frame portion is fixed to a heat sink, and a gap between the plurality of leads and the heat sink is less than 5.0 mm.

A rear thickness of the mold portion, which is a gap between a rear surface of the mold portion and rear surfaces of the plurality of leads, corresponds to the gap between the plurality of leads and the heat sink.

The semiconductor device may further include an insulating member that surrounds at least one of the plurality of leads.

The insulating member may surround a grasp portion of the lead.

The insulating member may surround a center lead of the plurality of leads which is bent.

A length of the insulating member is at least a length of a grasp portion of the center lead of the plurality of leads.

According to another aspect of an exemplary embodiment, there is provided a semiconductor device including a frame portion on which at least one semiconductor chip is arranged; a plurality of leads electrically connected to the semiconductor chip; and a mold portion formed on the frame portion to surround a part of the frame portion on which the semiconductor chip and the plurality of leads are arranged, wherein at least one of the plurality of leads is surrounded by an insulating mold portion to prevent a short circuit between adjacent leads.

The insulating mold portion may surround a part of the at least one of the plurality of leads.

The insulating mold portion may be integrally formed with the mold portion.

The insulating mold portion may surround a center lead of the plurality of leads.

A gap between the plurality of leads is at least 2.9 mm.

A gap between the plurality of leads is less than 5.0 mm.

Each of the plurality of leads has a uniform shape which forms an equal width as a whole.

According to another aspect of an exemplary embodiment, there is provided a semiconductor device including a frame portion on which at least one semiconductor chip is arranged; a plurality of leads electrically connected to the semiconductor chip; and a mold portion formed on the frame portion to surround a part of the frame portion on which the semiconductor chip and the plurality of leads are arranged, wherein the plurality of leads may be bent about a center along a length direction thereof, and wherein a gap between the plurality of leads is at least 2.9 mm.

A gap between the plurality of leads is less than 5.0 mm.

Horizontal cross-sections of the plurality of leads are in a "V"-shaped. In this case, the plurality of leads may be alternately arranged in a line so that bending directions thereof become reversed.

According to another aspect of an exemplary embodiment, there is provided a semiconductor device including a plurality of leads, wherein the plurality of leads may be arranged in a position that is apart from a rear surface of the mold portion for at least 2.9 mm.

The plurality of leads may be arranged in a position that is apart from a rear surface of the mold portion for less than 5.0 mm.

BRIEF DESCRIPTION OF THE DRAWINGS

The above and/or other aspects will be more apparent from the following detailed description, taken in conjunction with the accompanying drawings in which.

DETAILED DESCRIPTION OF THE EXEMPLARY EMBODIMENTS

Figure 1:
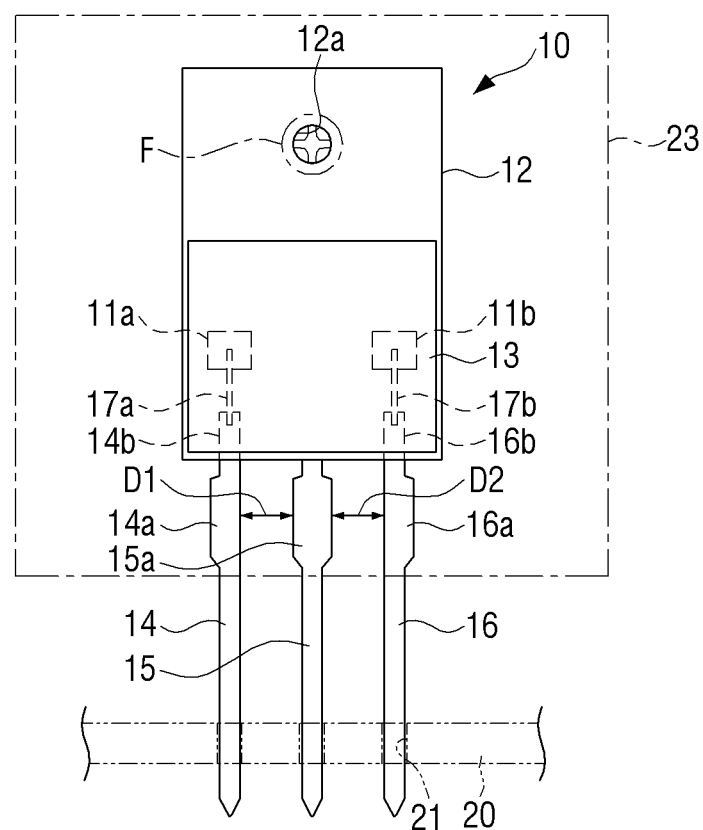
FIG. 1 is a front view illustrating a semiconductor device according to a first exemplary embodiment.

Exemplary embodiments will be described in detail with reference to the accompanying drawings. The embodiments to be described hereinafter are exemplary to help a comprehensive understanding of the present disclosure, and the present disclosure can be implemented in diverse modifications differently from the embodiments to be described hereinafter. In describing, well-known element structures and technologies are not described in detail since they would obscure the disclosure in unnecessary detail. Further, in the drawings, to help the understanding of the present disclosure, sizes of some constituent elements may be exaggerated for clarity in explanation.

In first to third exemplary embodiments to be described hereinafter, an FET for switching is exemplified. However, a semiconductor device according to the present disclosure is not limited thereto, and may be provided with a plurality of leads.

Figure 2:
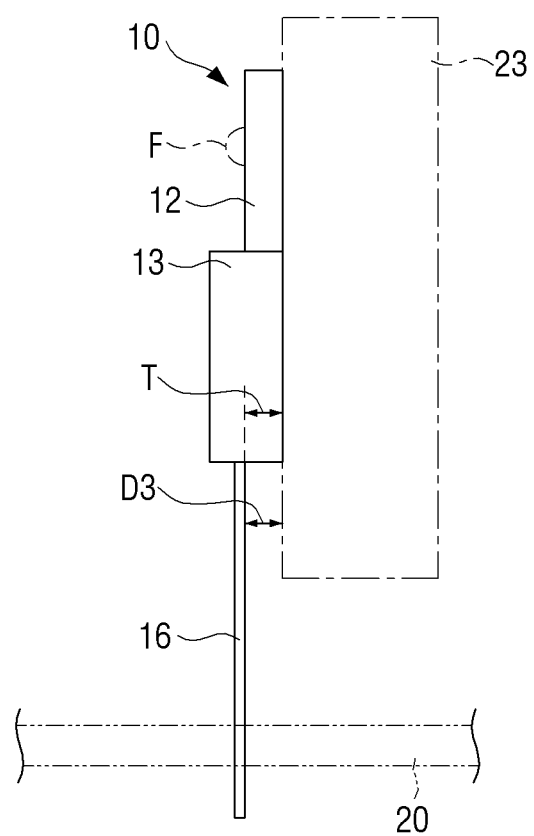
FIG. 2 is a side view illustrating a semiconductor device according to a first exemplary embodiment.

Referring to FIGS. 1 and 2, the configuration of a semiconductor device 10 according to a first exemplary embodiment will be described. FIG. 1 is a front view illustrating a semiconductor device according to a first exemplary embodiment, and FIG. 2 is a side view illustrating a semiconductor device that is fastened to a heat sink according to a first exemplary embodiment.

As illustrated in FIG. 1, the semiconductor device 10 includes a plurality of semiconductor chips 11a and 11b, a frame portion 12, a mold portion 13, and first to third leads 14, 15, and 16.

The plurality of semiconductor chips 11a and 11b include a predetermined circuit, and are arranged on one surface of the frame portion 12.

The frame portion 12 is in a plate shape having a predetermined area. The frame portion 12 includes a fastening hole 12a formed on one side thereof, through which a fastening screw F penetrates. The fastening screw F fixes the semiconductor device 10 to a predetermined structure, for example, a heat sink 23. The frame portion 12 may be made of a metal material having high heat conductivity to dissipate heat generated from the plurality of semiconductor chips 11a and 11b. In this case, a heat transfer compound may be spread onto a surface on which the frame portion 12 comes in contact with the heat sink 23 to improve heat transfer efficiency to the heat sink 23.

The mold portion 13 is formed on the frame portion 12, and surrounds a part of the frame portion 12 on which the plurality of semiconductor chips 11a and 11b and the first to third leads 14, 15, and 16 are arranged. It is preferable that the mold portion 13 is made of an insulating resin.

The first to third leads 14, 15, and 16 are inserted into a plurality of through-holes 21 of a printed circuit board (PCB) 20. Upper end portions 14b and 16b of the first lead 14 and the third lead 16 are connected to the semiconductor chips 11a and 11b through connection wirings 17a and 17b, respectively. In this case, the first lead 14 may correspond to a signal input terminal, and the third lead 16 may correspond to a signal output terminal. The second lead 15 may be connected to the frame portion 12 and may correspond to a ground terminal.

The first to third leads 14, 15, and 16 are not limited to the signal input terminal, the ground terminal, and the signal output terminal as described above, and the roles of the respective leads 14, 15, and 16 may be changed in the case where connections between the respective leads 14, 15, and 16, the plurality of semiconductor chips 11a and 11b, and the frame portion 12 are changed.

A first gap D1 between the first lead 14 and the second lead 15, and a second gap D2 between the second lead 15 and the third lead 16 may be 2.9 mm to 5.0 mm. The first gap D1 and the second gap D2 may be distances that can minimize the occurrence of short circuits between the leads 14, 15, and 16 due to the moisture condensation under high-moisture conditions and can minimize the occurrence of short circuits between the leads 14, 15, and 16 due to soldering ball inferiority between the leads 14, 15, and 16 and foreign substances.

Further, it is preferable that the first gap D1 and the second gap D2 are applied to the most adjacent portion of the first lead 14 and the second lead 15 and the most adjacent portion of the second lead 15 and the third lead 16.

If at least one of the leads is bent according to the user condition, each of the first to third leads 14, 15, and 16 have grasp portions 14a, 15a, and 16a formed thereon for enabling predetermined jigs (not illustrated) to stably clamp the first to third leads 14, 15, and 16.

Referring to FIG. 1, the grasp portions 14a, 15a, and 16a are formed with a width that is wider than the width of the other portions of the leads 14, 15, and 16. In this case, the most adjacent portions of the leads 14, 15, and 16 may be the grasp portions 14a, 15a, and 16a. Accordingly, if the grasp portions 14a, 15a, and 16a are formed on the leads 14, 15, and 16, the first gap D1 corresponds to the gap between the grasp portion 14a of the first lead 14 and the grasp portion 15a of the second lead 15, and the second gap D2 corresponds to the gap between the grasp portion 15a of the second lead 15 and the grasp portion 16a of the third lead 16.

Referring to FIG. 2, in the case where the frame portion 12 is fixed to the heat sink 23, a third gap D3 between the leads 14, 15, and 16 and the heat sink 23 may be 2.9 mm to 5.0 mm. The third gap D3 may be a distance that can minimize the occurrence of a short circuit between the leads 14, 15, and 16 and the heat sink 23 due to the moisture condensation under high-moisture conditions.

In order to keep the third gap D3 between the leads 14, 15, and 16 and the heat sink 23, a rear thickness T of the mold portion 13 corresponding to a gap between the rear surface of the mold portion 12 and the rear surfaces of the leads 14, 15, and 16 may be formed to correspond to the third gap D3.

Alternatively, it is also possible to move the positions of the leads 14, 15, and 16 to the front of the mold portion 13 to set the third gap D3.

Figure 3:
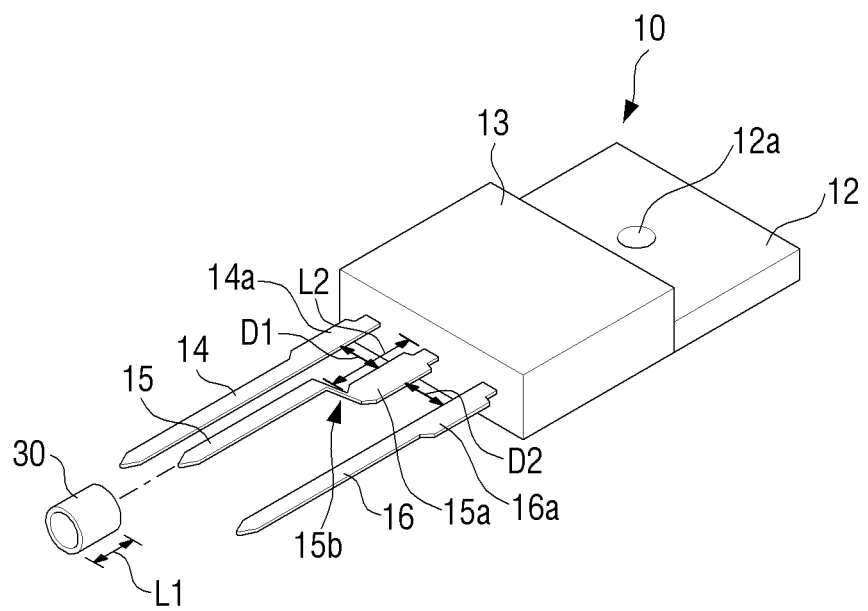
FIG. 3 is a perspective view illustrating a state where a center lead of a plurality of leads of a semiconductor device illustrated in FIG. 1 is bent and then an insulating tube is inserted therein.

FIG. 3 is a perspective view illustrating a state where a center lead of a plurality of leads of a semiconductor device illustrated in FIG. 1 is bent and then an insulating tube is inserted therein.

Referring to FIG. 3, in order to prevent short circuits between the first to third leads 14, 15, and 16 of the semiconductor device 10 more effectively, an insulating member 30 may be combined with at least one of the first to third leads 14, 15, and 16. If the semiconductor device 10 has three leads 14, 15, and 16, it may be exemplified that the insulating member 30 is combined with the second lead 15 that is positioned in the center of the leads 14, 15, and 16 so as to use the minimum number of insulating members 30.

The insulating member 30 may be in a tube shape so that it is combined with or separated from the leads 14, 15, and 16. In addition, as shown in FIG. 3, the insulating member 30 may be flexible to be easily combined with the second lead 15 that is in a bent state.

Further, a length L1 of the insulating member 30 may correspond to a length L2 in order to surround the grasp portion 15a of the second lead 15. However, the length L1 of the insulating member 30 is not limited thereto, but may be set to be long enough to surround even the grasp portion 15a and the bent portion 15b of the second lead 15 or more.

Figure 4:
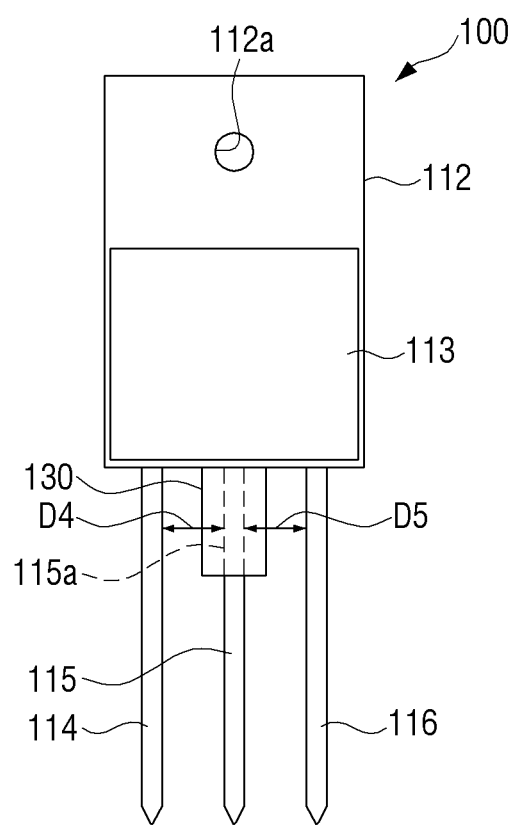
FIG. 4 is a front view illustrating a semiconductor device according to a second exemplary embodiment.

FIG. 4 is a front view illustrating a semiconductor device 100 according to a second exemplary embodiment.

Referring to FIG. 4, the semiconductor device 100 may include a plurality of leads of which a width is equal as a whole.

In this case, a fourth gap D4 between the first lead 114 and the second lead 115 that are adjacent to each other and a fifth gap D5 between the second lead 115 and the third lead 116 may be set to 2.9 mm to 5.0 mm.

Further, an insulating mold portion 130 of the semiconductor device 100 may surround a part of the second lead 115 that is adjacent to the mold portion 113. The insulating mold portion 130 may be formed to extend from the mold portion 113, and may be integrally formed with the mold portion 113.

While it is exemplified that the insulating mold portion 130 surrounds the second lead 115, it is not limited thereto, and the insulating mold portion 130 may be formed to surround at least one of the first to third leads 114, 115, and 116. Further, in the case where the semiconductor device has three or more leads, the insulating mold portion 130 may be appropriately formed on the leads that are arranged in one column or a plurality of columns.

Figure 5:
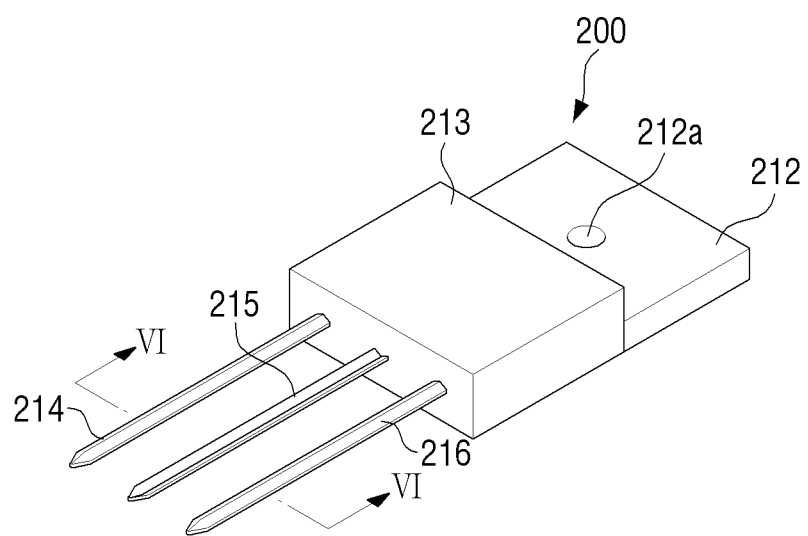
FIG. 5 is a perspective view illustrating a semiconductor device according to a third exemplary embodiment.
Figure 6:
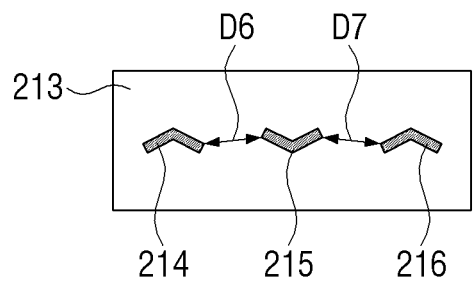
FIG. 6 is a cross-sectional view taken along line VI-VI indicated in FIG. 5.

FIG. 5 is a perspective view illustrating a semiconductor device according to a third exemplary embodiment, and FIG. 6 is a cross-sectional view taken along line VI-VI indicated in FIG. 5.

Referring to FIG. 5, the semiconductor device 200 may include the first to third leads 214, 215, and 216 which are formed to be bent about the center along the length direction of the first to third leads 214, 215, and 216.

Since the respective leads 214, 215, and 216 are formed to be bent, horizontal cross-sections of the leads are in a "V"-shaped. In this case, it is preferable that the leads 214, 215, and 216 may be alternately arranged in a line so that bending directions thereof become reversed.

According to the arrangement of the respective leads 214, 215, and 216, a sixth gap D6 between the first lead 214 and the second lead 215 that are most adjacent to each other and a seventh gap D7 between the second lead 215 and the third lead 216 that are most adjacent to each other may be set to 2.9 mm to 5.0 mm.

Since the horizontal cross-sections of the leads 214, 215, and 216 are bent in a "V"-shaped, the sixth gap D6 and the seventh gap D7 between the adjacent leads can be widened.

While exemplary embodiments have been particularly shown and described above, it will be understood by those skilled in the art that various changes may be made therein without departing from the spirit and scope of the present disclosure, as defined by the following claims.

What is claimed is:

1. A semiconductor device comprising:
   a frame portion on which at least one semiconductor chip is arranged;
   a plurality of leads electrically connected to the semiconductor chip; and
   a mold portion formed on the frame portion to surround a part of the frame portion on which the semiconductor chip and the plurality of leads are arranged,
   wherein a gap between closest portions of the respective leads is at least 2.9 mm,
   wherein the frame portion is fixed to a heat sink, and a gap between the plurality of leads and the heat sink is at least 2.9 mm, and
   wherein the plurality of leads are bent about a center of a cross section along a length direction thereof to prevent a short circuit between adjacent leads.

2. The semiconductor device as claimed in claim 1, wherein the gap between closest portions of the respective leads is less than 5.0 mm.

3. The semiconductor device as claimed in claim 1, wherein the plurality of leads have grasp portions formed thereon, and
   a width of the grasp portion is wider than a width of the other portion of the lead.

4. The semiconductor device as claimed in claim 3, wherein the gap between the closest portions of the respective leads is a gap between the grasp portions of the respective leads.

5. The semiconductor device as claimed in claim 1, wherein the gap between the plurality of leads and the heat sink is less than 5.0 mm.

6. The semiconductor device as claimed in claim 1, wherein a rear thickness of the mold portion, which is a gap between a rear surface of the mold portion and rear surfaces of the plurality of leads, corresponds to the gap between the plurality of leads and the heat sink.

7. The semiconductor device as claimed in claim 3, wherein at least one of the plurality of leads is combined with an insulating member.

8. The semiconductor device as claimed in claim 7, wherein the insulating member surrounds the grasp portion of the lead.

9. The semiconductor device as claimed in claim 7, wherein the at least one of the plurality of leads is a center lead of the plurality of leads which is bent.

10. The semiconductor device as claimed in claim 9, wherein a length of the insulating member is at least a length of a grasp portion of the center lead of the plurality of leads.

11. The semiconductor device as claimed in claim 2, wherein at least one of the plurality of leads is surrounded by an insulating mold portion to prevent a short circuit between adjacent leads.

12. The semiconductor device as claimed in claim 11, wherein the insulating mold portion surrounds a part of the at least one of the plurality of leads.

13. The semiconductor device as claimed in claim 11, wherein the insulating mold portion is integrally formed with the mold portion.

14. The semiconductor device as claimed in claim 11, wherein the at least one of the plurality of leads is a center lead of the plurality of leads.

15. The semiconductor device as claimed in claim 11, wherein each of the plurality of leads has a uniform shape which forms an equal width as a whole.

16. The semiconductor device as claimed in claim 1, wherein horizontal cross-sections of the plurality of leads are in a "V"-shaped.

17. The semiconductor device as claimed in claim 1, wherein the plurality of leads are alternately arranged in a line so that bending directions thereof become reversed.

18. The semiconductor device as claimed in claim 1, wherein each of the plurality of leads has a uniform shape which forms an equal width as a whole.

* * * * *